United States Patent [19]

Ishihara et al.

[11] Patent Number: 5,160,543
[45] Date of Patent: Nov. 3, 1992

[54] DEVICE FOR FORMING A DEPOSITED FILM

[75] Inventors: Shunichi Ishihara, Ebina; Masaaki Hirooka, Toride; Jun-Ichi Hanna; Isamu Shimizu, both of Yokohama, all of Japan

[73] Assignee: Canon Kabushiki Kaisha, Tokyo, Japan

[21] Appl. No.: 837,601

[22] Filed: Feb. 21, 1992

Related U.S. Application Data

[63] Continuation of Ser. No. 441,223, Nov. 27, 1989, abandoned, which is a continuation of Ser. No. 943,429, Dec. 19, 1986, abandoned.

[30] Foreign Application Priority Data

Dec. 20, 1985 [JP] Japan ............... 60-287103
Dec. 27, 1985 [JP] Japan ............... 60-297212
Dec. 28, 1985 [JP] Japan ............... 60-297836

[51] Int. Cl.⁵ ............................. C23C 16/00
[52] U.S. Cl. ........................ 118/715; 118/725
[58] Field of Search ............... 118/715, 723, 725

[56] References Cited

U.S. PATENT DOCUMENTS

| | | | |
|---|---|---|---|
| Re. 31,708 | 10/1984 | Gordon | 427/126.2 |
| 2,552,626 | 5/1951 | Fisher et al. | 201/64 |
| 3,083,550 | 4/1963 | Auerbach | 65/3 |
| 3,188,230 | 6/1965 | Bakish et al. | 117/107.1 |
| 3,203,827 | 8/1965 | Hill | 117/107.2 |
| 3,220,880 | 11/1965 | Feuersanger | 118/725 |
| 3,224,912 | 12/1965 | Ruehrwein | 148/175 |
| 3,297,501 | 1/1967 | Reisman | 156/615 |
| 3,306,768 | 2/1967 | Peterson | 117/106 |
| 3,466,191 | 9/1969 | Stinchfield et al. | 117/213 |
| 3,506,556 | 4/1970 | Illery et al. | 204/192 |
| 3,655,429 | 4/1972 | Deklerk | 117/106 |
| 3,664,866 | 5/1972 | Manasevit | 117/201 |
| 3,850,679 | 11/1974 | Sopko et al. | 117/106 |
| 3,870,558 | 3/1975 | Shimizu et al. | 117/201 |
| 3,984,587 | 10/1976 | Lipp | 427/70 |
| 4,058,430 | 11/1977 | Suntola et al. | 156/611 |
| 4,096,822 | 6/1978 | Yamawaki et al. | 118/48 |
| 4,105,810 | 8/1978 | Yamazaki | 427/255 |
| 4,131,659 | 12/1978 | Authier | 264/25 |
| 4,146,657 | 3/1979 | Gordon | 427/126 |
| 4,147,571 | 4/1979 | Stringfellow | 148/175 |
| 4,180,596 | 12/1979 | Crowder et al. | 427/42 |
| 4,206,252 | 6/1980 | Gordon | 427/160 |
| 4,239,811 | 12/1980 | Kemlage | 427/95 |
| 4,282,267 | 8/1981 | Kuyel | 427/38 |
| 4,328,261 | 5/1982 | Heinecke et al. | 427/91 |
| 4,357,179 | 11/1982 | Adams et al. | 148/1.5 |
| 4,359,490 | 11/1982 | Lehrer | 427/95 |
| 4,402,762 | 9/1983 | John et al. | 148/1.5 |
| 4,416,217 | 11/1983 | Nakamura et al. | 118/696 |
| 4,422,407 | 12/1983 | Bessot et al. | 118/723 |
| 4,446,815 | 5/1984 | Kalbskopf | 118/718 |
| 4,448,801 | 5/1984 | Fukuda et al. | 427/39 |
| 4,515,107 | 5/1985 | Fournier et al. | 118/718 |
| 4,526,809 | 7/1985 | Hall et al. | 427/74 |
| 4,529,679 | 7/1985 | Ogawa et al. | 430/84 |
| 4,554,180 | 11/1985 | Hirooka | 427/248.1 |
| 4,595,601 | 6/1986 | Horioka et al. | 427/53.1 |
| 4,615,905 | 10/1986 | Ovshinsky | 427/39 |
| 4,637,938 | 1/1987 | Lee | 427/53.1 |
| 4,650,539 | 3/1987 | Irvine et al. | 156/613 |
| 4,652,463 | 3/1987 | Peters | 427/53.1 |

FOREIGN PATENT DOCUMENTS 199585 10/1986 European Pat. Off. ............ 118/722

OTHER PUBLICATIONS

Brodsky, IBM TDB vol. 22, No. 8A Jan. 1988, pp. 3391–3392.

*Primary Examiner*—Richard Bueker
*Attorney, Agent, or Firm*—Fitzpatrick, Cella, Harper & Scinto

[57] ABSTRACT

There is disclosed a device for forming a deposited film on a substrate through utilization of chemical reaction between a gaseous starting material for a film to be formed and a gaseous halogenic oxidizing agent which has one or more gas introducing means having a multi-tubular structure with a converted tip end or having a meeting space for both the gases.

4 Claims, 4 Drawing Sheets

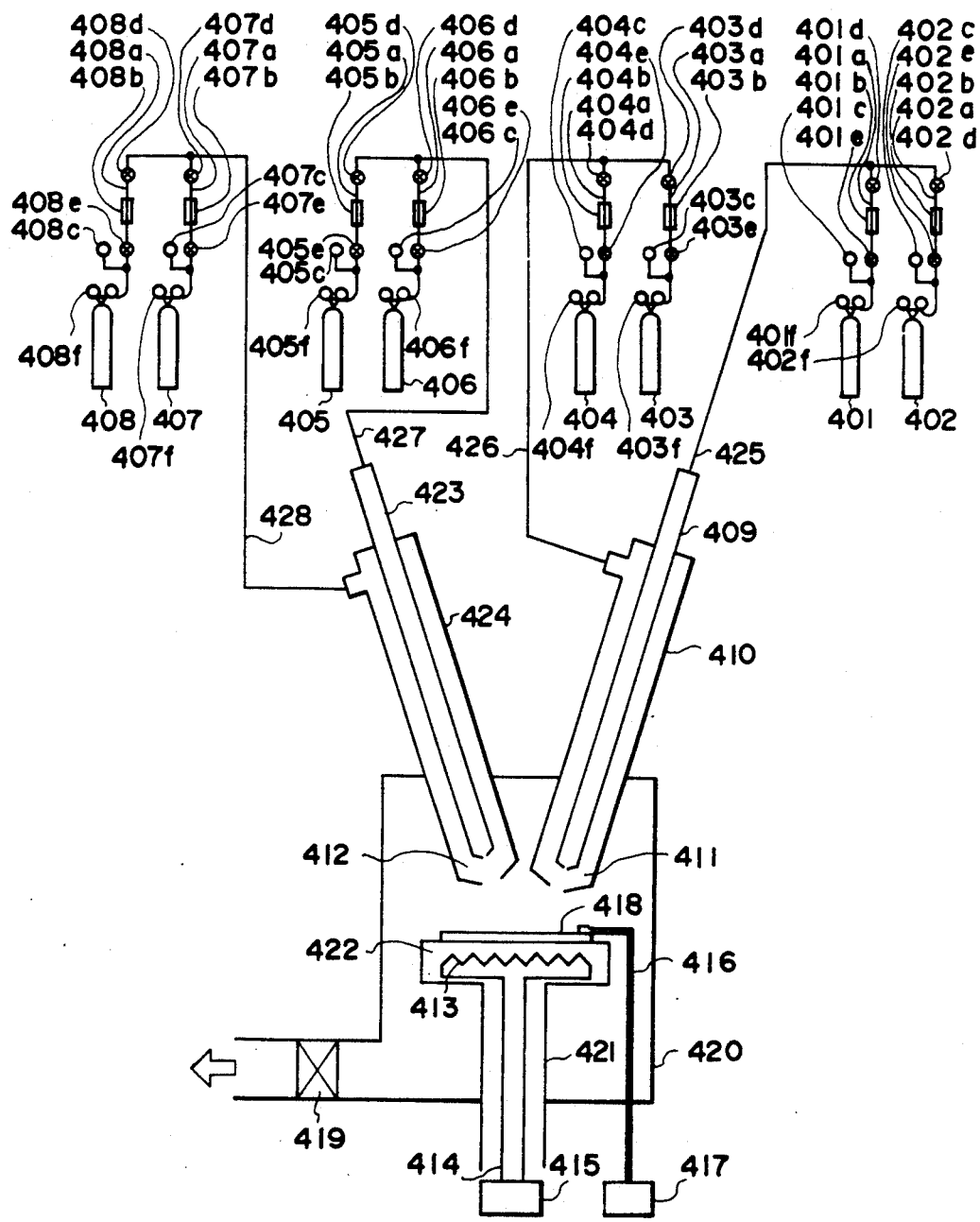

DEVICE FOR FORMING A DEPOSITED FILM

This application is a continuation of application Ser. No. 441,223, filed Nov. 27, 1989, now abandoned, which is a continuation application of application Ser. No. 943,429, filed Dec. 19, 1986, now abandoned.

BACKGROUND OF THE INVENTION

1. Field of the Invention

This invention relates to a device for forming a deposited film to be used for formation of a functional film, particularly a functional deposited film which is useful for an electronic device such as semiconductor device, photosensitive device for electrophotography, optical input sensor device for optical image inputting device, etc.

2. Related Background Art

In the prior art, for formation of amorphous or polycrystalline functional films such as semiconductor films, insulating films, photoconductive films, magnetic films, metal films, etc., suitable film forming methods have been individually employed from the standpoint of desired physical characteristics, uses, etc.

For example, for formation of silicon deposited film such as of non-single crystalline silicon including amorphous and polycrystalline silicon which are optionally compensated for lone pair electrons with a compensating agent such as hydrogen atoms (H) or halogen atoms (X), etc., (hereinafter abbreviated as "NON-Si (H,X)", particularly "A-Si (H,X)" when indicating amorphous silicon and "poly-Si (H,X)" when indicating polycrystalline silicon) (the so called microcrystalline silicon is included within the category of A-Si (H,X) as a matter of course), there have been used as an attempt the vacuum vapor deposition method, the plasma CVD method, the thermal CVD method, the reactive sputtering method, the ion plating method, the optical CVD method, etc. Generally, the plasma CVD method has been widely used and industrialized.

However, the reaction process in formation of a silicon deposited film according to the plasma CVD method which has been generalized in the prior art is considerably complicated as compared with the CVD method of the prior art, and its reaction mechanism involves not a few ambiguous points. Also, there are a large number of parameters for formation of a deposited film (for example, substrate temperature, flow rates and flow rate ratio of introduced gases, pressure during film formation, high frequency power, electrode structure, structure of reaction vessel, evacuation rate, plasma generating system, etc.).

On account of dependence on such a large number of parameters, plasma may sometimes become an unstable state, whereby marked deleterious influences were exerted frequently on a deposited film formed. Besides, parameters specific to individual devices must be selected for each device and therefore under the present situation it is actually difficult to standardize the production conditions.

On the other hand, for silicon deposited films to exhibit sufficiently satisfactory electrical or optical characteristics for respective uses, it is accepted as the best method to form them according to the plasma CVD method.

However, depending on the application use of silicon deposited films, bulk production with reproducibility may be required with full satisfaction in terms of enlargement of area, uniformity of film thickness as well as uniformity of film quality, and therefore in formation of such silicon deposited films according to the plasma CVD method, enormous installation investment will be required for a bulk production device and also control items for bulk production will be complicated with a narrow tolerance limit for control and a delicate operating condition of a device. These are pointed out as problems to be improved in future.

Also, in the case of the plasma CVD method, since plasma is directly generated by high frequency or microwave, etc., in a film forming space in which a substrate for film formation is arranged, electrons or a number of ion species generated may give cause damage to a film in the film forming process to cause lowering in film quality or non-uniformization of film quality.

For the improvement of this point, the indirect plasma CVD method was proposed.

The indirect plasma CVD method was developed to use selectively effective chemical species for film formation by forming plasma by microwave, etc., at an upstream position apart from a film forming space and transporting said plasma to the film forming space.

However, even in the indirect plasma CVD method, transport of plasma is essentially required and therefore the chemical species effective for film formation must have long life, whereby the gas species which can be employed are spontaneously limited, thus failing to give various deposited films. Also, enormous energy is required for generation of plasma, and generation of the chemical species effective for film formation and their amounts cannot be essentially placed under simple control. Thus, various problems remain to be solved.

As contrasted to the plasma CVD method, the optical CVD method is advantageous in that no ion species or electrons are generated which give damages to the film quality during film formation. However, there are problems such that light source does not include so much kinds, that the wavelength of light source tends to be toward UV-ray side, that a large scale light source and its power source are required in the case of industrialization, that a window for permitting light from a light source to be introduced into a film forming space is coated with a film during film formation to result in lowering in dose during film formation, which may further lead to shut-down of the light from the light source into the film forming space.

There is proposed recently a new method for forming a deposited film quite different in film forming process from the above-mentioned methods. FIG. 1 illustrates an embodiment of the apparatus realizing such a method for forming a deposited film as a schematic drawing.

The deposited film forming device shown in FIG. 1 is broadly divided into a main body, an evacuation system and a gas feeding system.

In the main body, a reaction space and a film forming space are provided.

101–105 are respectively bombs filled with gases to be used during film formation, 101a–105a are respectively gas feeding pipes, 101b–105b are respectively mass flow controllers for controlling the flow rates of gases from the respective bombs, 101c–105c are respectively gas pressure gauges, 101d–105d and 101e–105e are respectively valves, and 101f–105f are respectively pressure gauges indicating the pressures in the corresponding gas bombs.

120 is a vacuum chamber equipped at the upper portion with a means for gas introduction, having a structure for formation of a reaction space downstream of the gas introducing means, and also having a structure for formation of a film forming space in which a substrate holder 112 is provided so that a substrate 118 may be placed in oppostion to the gas introducing port of said means. The means for gas introduction has a double concentric arrangement structure, having from the innerside a first gas introducing pipe 109 for introducing gases from the gas bombs 101, 102, and a second gas introducing pipe 110 for introducing gases from the gas bombs 103-105. 111 is the tip end portion of the gas introducing pipes 109 and 110 and constitutes the gas introducing port. The dimension and arrangement of the gas introducing pipes 109 and 110 at the gas introducing port 111 are same as those at the upflow side, that is, they are in a straight double concentric structure. Further, the ends of the gas introducing pipes 109 and 110 are arranged evenly within a single plane. In this case, since the gas introducing port to the reaction space has the above-explaned structure, gases from the gas introducing pipes 109 and 110 are individually introduced into the reaction space and then mixed therein.

Gases from the gas bombs are fed to the respective introducing pipes through the gas feeding pipelines 123 and 124, respectively.

The respective gas introducing pipes, the respective gas feeding pipelines and the vacuum chamber 120 are adapted to be evacuated to vacuum through the main vacuum valve 119 by means of an evacuating device not shown.

A substrate 118 is suitably placed at a desired distance from the positions of the respective gas introducing pipes by moving vertically the substrate holder 112.

113 is a heater for heating a substrate which is provided in order to heat a substrate to an appropriate temperature during film formation, or preheating a substrate 118 before film formation, or further to anneal a film after film formation.

The substrate heating heater 113 is supplied with power through a conductive wire 114 from a power source 115.

116 is a thermocouple for measuring the temperature of a substrate (Ts) and is electrically connected to a temperature display device 117.

An example of film forming process with the use of the device for formation of a deposited film shown in FIG. 1 is described below.

At first, after completing the predetermined gas supply procedure, SiH4 gas filled in the bomb 101 and F2 gas diluted to 5% with He gas (referred to F2(5)/He gas) were introduced to the reaction space to the gas blowing port 111 through the gas introducing pipes 109 and 110 respectively. SiH4 gas and F2(5)/ He gas introduced into the reaction space are therein mixed with each other and chemical reaction is caused by the oxidization action of F2 gas. A substrate 118 is then exposed to the atmosphere where the chemical reaction is in progress and an Si : H : F film is thereby formed on the substrate 118.

As above, a deposited film forming process using the device for forming a deposited film shown in FIG. 1 has the advantage that only mixing in the reaction space of gases suitably selected and used as desired enables film formation. The device shown in FIG. 1 is not so complicated and expensive as devices used in e.g. the PCVD process. Further, the film suffers from no ion damage or particle damage and thus a film of high quality can be formed.

The deposited film forming process described above is very simple while the gas mixing technique in the reaction space is an important parameter which decides the quality of a film formed.

As described above, in formation of silicon deposited film, points to be solved still remain, and it has been earnestly desired to develop a method for forming a deposited film which is capable of bulk production with conservation of energy by the use of a device of low cost, while maintaining the practically utilizable characteristics and the uniformity. These are in common with the cases of other functional films such as silicon nitride films, silicon carbide films, silicon oxide films for the similar problems which should be solved respectively.

SUMMARY OF THE INVENTION

An object of the present invention is to remove the drawbacks of the method for forming deposited films as described above and at the same time to provide a novel device for forming a deposited film without the use of the formation method of the prior art.

Another object of the present invention is to effect conservation of energy and at the same time to provide a device for forming a deposited film adapted to obtaining a deposited film with uniform characteristics over a large area with easy control of film quality.

Still another object of the present invention is to provide a device for forming a deposited film by which a film excellent in productivity and bulk productivity, having high quality as well as excellent physical characteristics such as electrical, optical and semiconductor characteristics can be easily obtained.

According to an aspect of the present invention, there is provided a device for introducing a gaseous starting material for formation of a deposited film and a gaseous halogenic oxidizing and said standing property of oxidation action for said starting material into a reaction space to effect chemical contact therebetween and form a plural number of precrsors containing a precursor under excited state and thereby forming a deposited film on a substrate existing in a film forming space with the use of at least one precursor of those precursors as a feeding source for the constituent element of the deposited film, which comprises a means for introducing said gaseous starting material and said gaseous halogenic oxidizing agent into said reaction space having a multi-tubular structure with a converged tip end.

According to another aspect of the present invention, there is provided a device for introducing a gaseous starting material for formation of a deposited film and a gaseous halogenic oxidizing agent having the property of oxidation action on said starting material into a reaction space to effect chemical contact therebetween and form a plural number of precursors containing a precursor under excited state and thereby forming a deposited film on a substrate existing in a film forming space with the use of at least one precursor of those precursors as a feeding source for the constituent element of the deposited film, which comprises a means for introducing said gaseous starting material and said gaseous halogenic oxidizing agent into said reaction space having a meeting space for both the gases.

According to still another aspect of the present invention, there is provided a device for introducing a plural number of gaseous starting materials for formation of a deposited film and a gaseous halogenic oxidizing agent having the property of oxidation action on said starting materials into a reaction space to effect chemical contact therebetween and form a plural number of precursors containing a precursor under excited state and thereby forming a deposited film containing two or more elements on a substrate existing in a film forming space with the use of at least one precursor of those precursors as a feeding source for the constituent elements of the deposited film, which comprises a means for introducing said gaseous starting materials and said gaseous halogenic oxidizing agent into said reaction space having a plural number of multi-tubular structures.

BRIEF DESCRIPTION OF THE DRAWINGS

FIG. 4 is a schematic illustration of a third preferred embodiment of the device for forming a deposited film of the present invention.

DESCRIPTION OF THE PREFERRED EMBODIMENT

Figure 1:
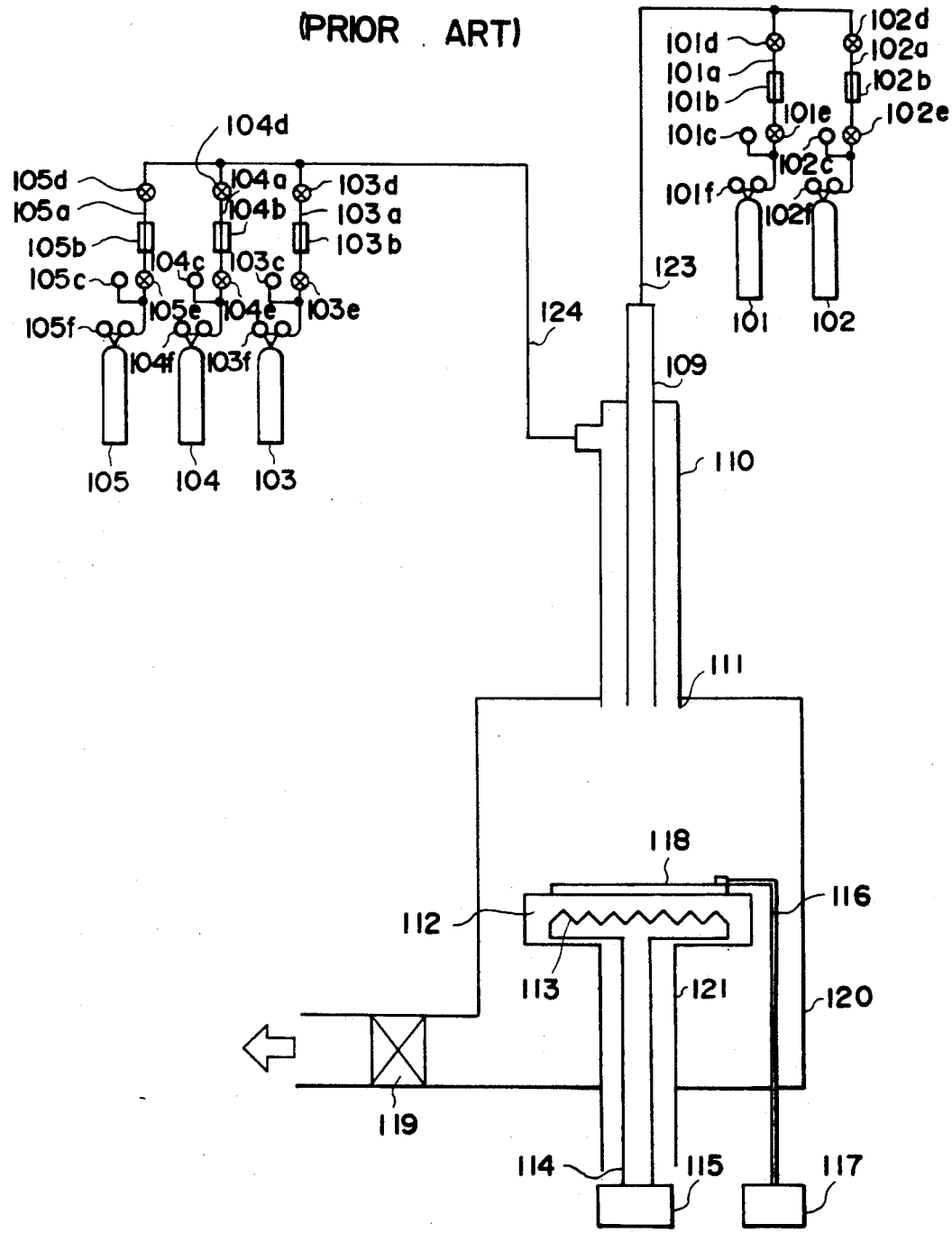
FIG. 1 is a schematic illustration of a deposited film forming device of the prior art regarding the present invention.
Figure 2:
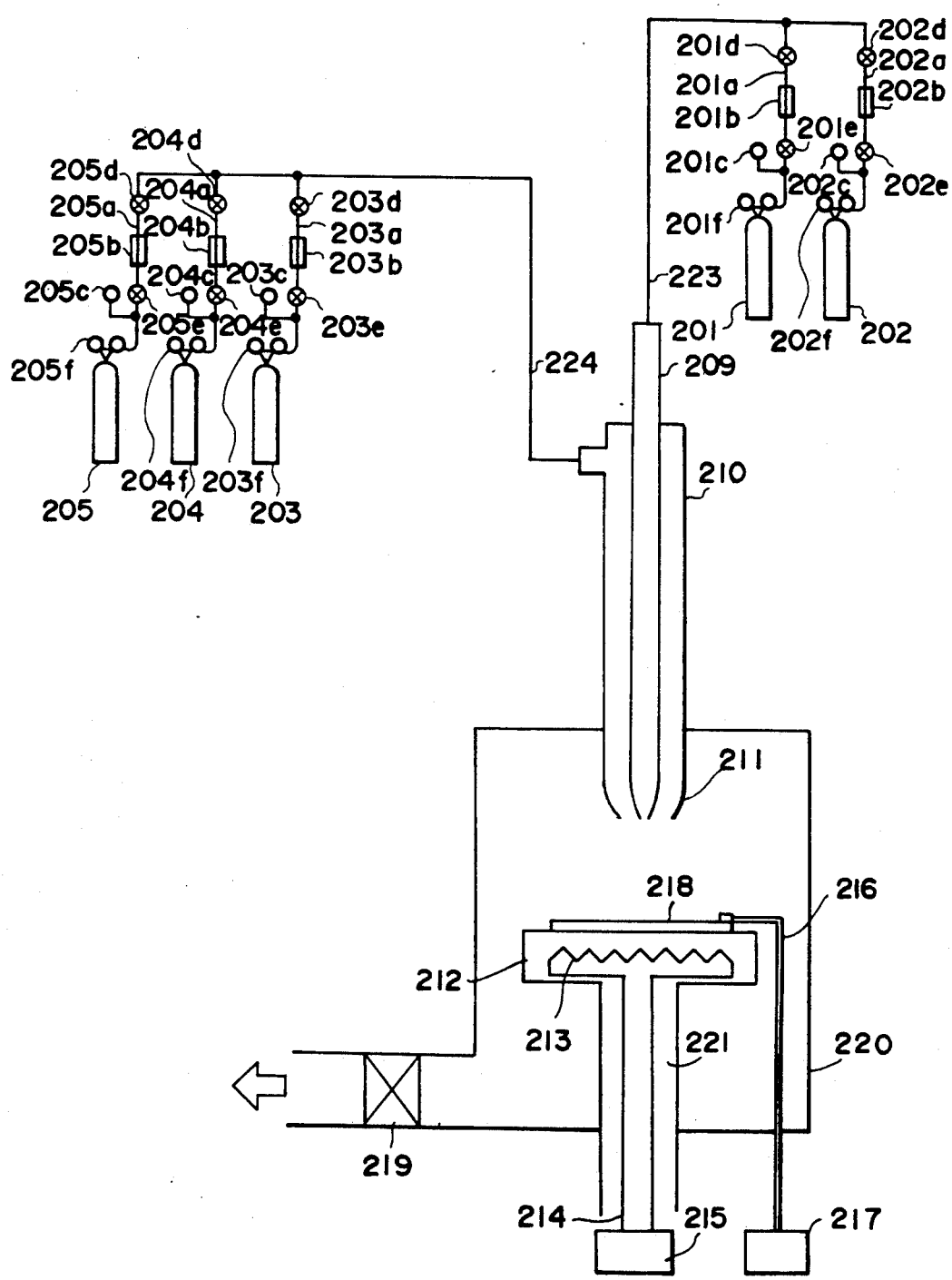
FIG. 2 is a schematic illustration of a first preferred embodiment of the device for forming a deposited film of the present invention.

FIG. 2 shows a first preferred embodiment of the device for forming a deposited film of the present invention.

The deposited film forming device shown in FIG. 2 is broadly divided into a main body, an evacuation system and a gas feeding system.

In the main body, a reaction space and a film forming space are provided.

201-205 are respectively bombs filled with gases to be used during film formation, 201a-205a are respectively gas feeding pipes, 201b-205b are respectively mass flow controllers for controlling the flow rates of gases from the respective bombs, 201c-205c are respectively gas pressure gauges, 201d-205d and 201e-205e are respectively valves, and 201f-205f are respectively pressure gauges indicating the pressures in the corresponding gas bombs.

220 is a vacuum chamber equipped at the upper portion with a means for gas introduction, having a structure for formation of a reaction space downstream of the gas introducing means, and also having a structure for formation of a film forming space in which a substrate holder 212 is provided so that a substrate 218 may be placed in opposition to the gas introducing port of said means. The means for gas introduction has a double concentric arrangement structure, having from the innerside a first gas introducing pipe 209 for introducing gases from the gas bombs 201, 202, and a second gas introducing pipe 210 for introducing gases from the gas bombs 203-205. 211 is the gas introducing port constituting the tip portions of the gas introducing pipes 209 and 210 and its tip end is narrowed, preferably to a diameter of about 1 mm. Within the gas introducing port 211, a gaseous starting material and gaseous halogenic oxidizing agent are converted and forced into contact chemically each other to form precursors. The precursors are forced to flow against the substrate to effect film formation thereon Gases from the gas bombs are fed to the respective introducing pipes through the gas feeding pipelines 223 and 224, respectively.

The respective gas introducing pipes, the respective gas feeding pipelines and the vacuum chamber 220 are adapted to be evacuated to vacuum through the main vacuum valve 219 by means of an evacuating device not shown.

A substrate 218 is suitably placed at a desired distance from the positions of the respective gas introducing pipes by moving vertically the substrate holder 212.

213 is a heater for heating a substrate which is provided in order to heat a substrate to an appropriate temperature during film formation, or preheating a substrate 218 before film formation, or further to anneal a film after film formation.

The substrate heating heater 213 is supplied with power through a conductive wire 214 from a power source 215.

216 is a thermocouple for measuring the temperature of a substrate (Ts) and is electrically connected to a temperature display device 217.

Figure 3:
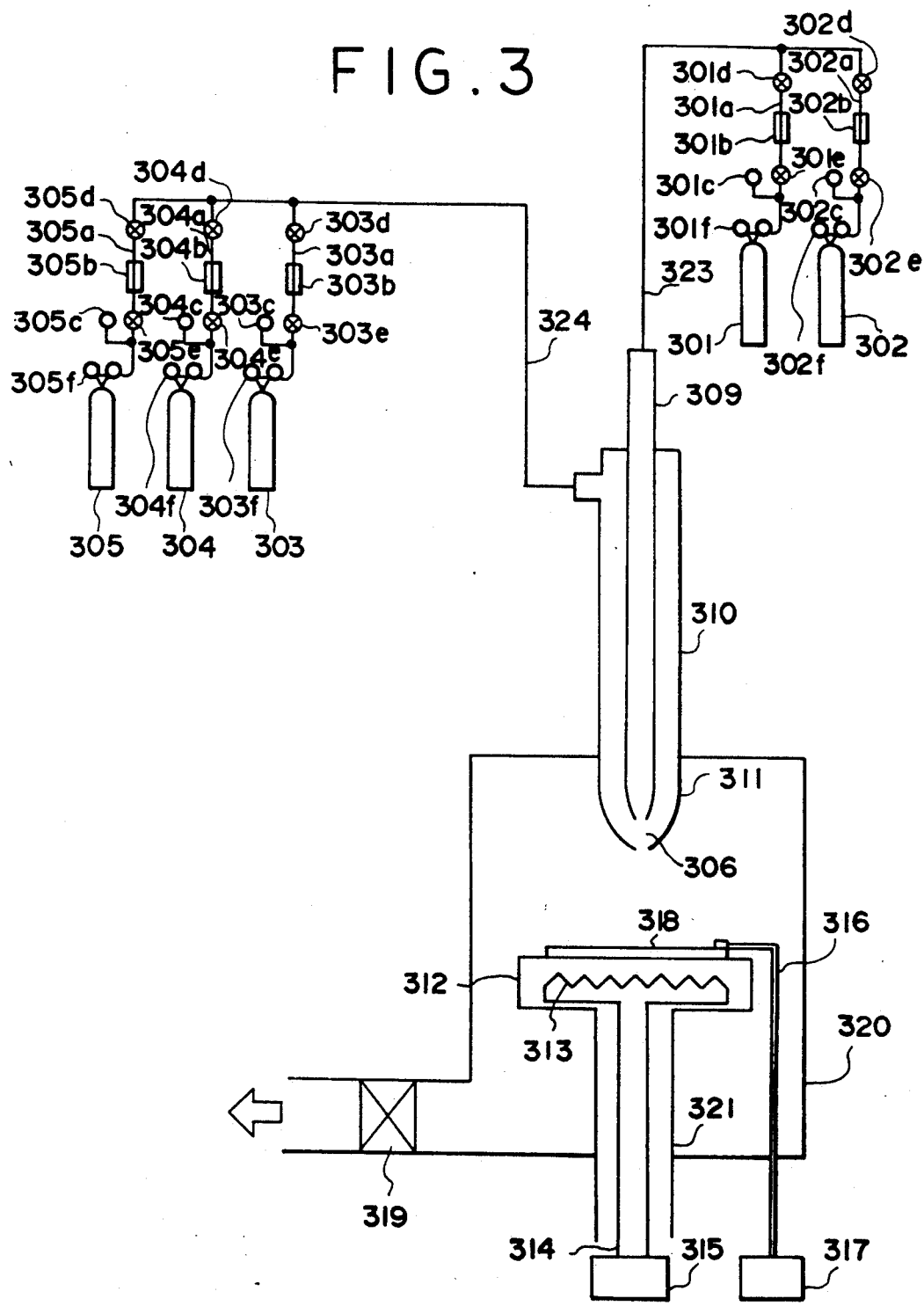
FIG. 3 is a schematic illustration of a second preferred embodiment of the device for forming a deposited film of the present invention.

FIG. 3 shows a second preferred embodiment of the device forming a deposited film of the present invention.

The deposited film forming device shown in FIG. 3 is broadly divided into a main body, an evacuation system and a gas feeding system.

In the main body, a reaction space and a film forming space are provided.

The device shown in FIG. 3 is not essentially different from the device shown in FIG. 2 except that the shape and structure of the tip end portion of gas introducing pipes 309 and 310 is modified.

Accordingly, the overlapping description of the same portions of the device as those in FIG. 2 is omitted while the denotation of each reference is described below as follows:

| | |
|---|---|
| 301-305 | gas bombs |
| 301a-305a | gas feeding pipes |
| 301b-305b | mass flow meters |
| 301c-305c | gas pressure gauges |
| 301d-305d and 301e-305e | valves |
| 301f-305f | pressure gauges |
| 306 | meeting space for gases |
| 309, 310 | gas introducing pipes |
| 311 | gas introducing port |
| 312 | substrate holder |
| 313 | heater for heating substrate |
| 316 | thermocouple for monitoring substrate temperature |
| 318 | substrate |
| 319 | vacuum evacuation valve. |

The characteristic feature of the device shown in FIG. 3 is that the means for gas introduction has a double concentric arrangement structure, having from the innerside a first gas introducing pipe 309 for introducing the gases from the gas bombs 301, 302, and a second gas introducing pipe 310 for introducing the gases from the gas bombs 303-305.

The tip end of the gas introducing pipe 309 is narrowed, preferably to a diameter of about 1 mm so that no reverse diffusion of gas introduced from the gas introducing pipe 310 will occur. 311 is a gas introducing port having a meeting space for gases 306, and its outlet is narrowed, preferably to a diameter of about 1 mm. Within the meeting space 306, the above gaseous starting material and the above gaseous halogenic oxidizing agent undergo chemical contact with each other to form precursors. The precursors are forced to flow against the substrate to form a film thereon.

The meeting space 306 is a space located between the tip end outlets of gas introducing pipes 309 and 310, and is formed within the tip end portion of gas introducing pipe 310. The dimension of the meeting space 306, if represented as the distance from the tip end of gas introducing pipe 309 to the tip end of gas introducing pipe 310, is preferably around 1 cm.

FIG. 4 shows a third preferred embodiment of the device for forming a deposited film of the present invention.

The deposited film forming device shown in FIG. 4 is broadly divided into a main body, an evacuation system and a gas feeding system.

In the main body a reaction space and a film forming space are provided.

The device shown in FIG. 4 is not essentially different from the device shown in FIG. 2 or FIG. 3 except that a plural number of gas introducing means having a double-tubular structure are provided. In FIG. 4, the number of gas introducing means is two, but a larger number of gas introducing means may be employed depending on the number of gas species to be used and the purpose of film formation.

Similarly as the description of FIG. 3, the overlapping description of the same portions of the device as those in FIG. 2 is omitted while the denotation of each reference is described below as follows:

| | |
|---|---|
| 401–408 | gas bombs |
| 401a–408a | gas feeding pipes |
| 401b–408b | mass flow meters |
| 401c–408c | gas pressure gauges |
| 401d–408d and 401e–408e | valves |
| 401f–408f | pressure gauges |
| 409, 410, 423, 424 | gas introducing pipes |
| 411, 412 | gas introducing ports |
| 413 | heater for heating substrate |
| 416 | thermocouple for monitoring substrate temperature |
| 418 | substrate |
| 419 | vacuum evacuation valve |
| 422 | substrate holder. |

The characteristic feature of the device shown in FIG. 4 is that two gas introducing means are provided at the upper portion of the vacuum chamber 420 having a structure for formation of a reaction space downstream of the gas introducing means, and also having a structure for formation of a film forming space in which a substrate holder 412 is provided so that a substrate may be placed as opposed to the gas introducing ports at the tip ends of the gas introducing pipes Each gas introducing means has a double concentric arrangement structure, having a first gas introducing means 411 comprising from the innerside a first gas introducing pipe 409 for introducing gases from the gas bombs 401, 402, a second gas introducing pipe 410 for introducing gases from the gas bombs 403, 404, and a second gas introducing means 412 comprising a third gas introducing pipe 423 for introducing gases from the gas bombs 405, 406 and a fourth gas introducing pipe 424 for introducing gases from the gas bombs 407, 408.

In the case of the present invention, the distance between the substrate and the gas discharging outlet of the gas introducing pipe may be determined appropriately in view of the kinds and the desired characteristics of the deposited film formed, gas flow rates, inner pressure of the vacuum chamber, etc., but it is preferably several mm to 20 cm, more preferably 5 mm to about 15 cm.

According to the device for forming a deposited film of the present invention, as described above, simplification of control and bulk production can be effected with full satisfaction of enlargement of area, uniformity of film thickness and uniformity of film quality simultaneously with conservation of energy, without requiring an enormous installation investment for bulk production apparatus, and also the control items for its bulk production is clarified to afford a broad tolerance limit of control and simple control of the device.

In the device for forming a deposited film of the present invention, the gaseous starting material to be used for formation of a deposited film receives oxidizing action through chemical contact with the gaseous halogenating oxidizing agent and can be selected suitably as desired depending on the kind, characteristic, use, etc., of the desired deposited film. In the present invention, the above gaseous starting material and the gaseous halogenic oxidizing agent have only to be those which can be made gaseous prior to chemical contact, and they can be either liquid or solid as ordinary state.

When the starting material for formation of a deposited film or the halogenic oxidizing agent is liquid or solid, the starting material for formation of a deposited film and the halogenic oxidizing agent are introduced in gaseous state into the reaction space through performing bubbling with the use of carrier gas such as Ar, He, $N_2$, $H_2$, etc., optionally with application of heat.

Upon this operation, the partial pressures and mixing ratio of the above gaseous starting material and the gaseous halogenic oxidizing agent may be set by controlling the flow rate of the carrier gas and the vapor pressures of the starting material for formation of the deposited film and the gaseous halogenic oxidizing agent.

As the starting material for formation of a deposited film to be used in the present invention, for example, if tetrahedral type deposited films such as semiconductive or electrically insulating silicon deposited films or germanium deposited films, etc., are desired to be obtained, straight or branched chain silane compounds, cyclic silane compounds, chain germanium compounds, etc., may be employed as effective ones.

Specifically, examples of straight chain silane compounds may include $Si_nH_{2n+2}$ (n=1, 2, 3, 4, 5, 6, 7, 8), examples of branched chain silane compounds include $SiH_3SiH(SiH_3)SiH_2SiH_3$, and examples of chain germanium compounds include $Ge_mH_{2m+2}$ (m=1, 2, 3, 4, 5), etc. Otherwise, for example, if deposited films of tin are desired to be prepared, hydrogenated tin such as $SnH_4$, etc., may be employed as effective starting material.

Of course, these starting materials may be used either as a single kind or as a mixture of two or more kinds.

The halogenic oxidizing agent to be used in the present invention have only to be gaseous when introduced into the reaction space and at the same time has the property of effectively oxidizing the gaseous starting material for formation of a deposited film introduced into the reaction space by mere chemical contact therewith, including halogen gases such as $F_2$, $Cl_2$, $Br_2$, $I_2$, FCl, FBr, etc., and fluorine, chlorine, bromine, etc., under nascent state as effective ones.

These halogenic oxidizing agents are introduced into the reaction space under gaseous state together with the gas of the starting material for formation of a deposited film as described above with desired flow rate and feeding pressure wherein they are mixed with and collide against the above starting material to be chemically contacted therewith, thereby oxidizing the above starting material to generate efficiently a plural kinds of precursors containing precursors under excited state. Of the precursors under excited state and other precursors generated, at least one of them functions as a feeding source for the constituent element of the deposited film formed.

The precursors generated may undergo decomposition or reaction to be converted to other precursors under excited state or to precursors under another excited state, or alternatively stand unchanged in their original forms, although, if desired, releasing energy to contact with the substrate surface arranged in a film forming space, whereby a deposited film with a three-dimensional network structure is prepared.

The energy level when excited is preferably one where a precursor in the excited state will be subjected to energy transition to a lower energy level or change to another chemical species accompanied with luminescence. By formation of activated precursors including such precursors under excited state as accompanied with luminescence upon transition of energy, the deposited film forming process of the present invention proceeds with better efficiency and more conservation of energy to form a deposited film having uniform and better physical characteristics over the whole film surface.

In the present invention, so that the deposit film forming process may proceed smoothly to form a film of high quality and having desired physical characteristics, as film forming factors, the kinds and combination of the starting material and the halogenic oxidizing agent, mixing ratio of these, pressures and flow rate during mixing, inner pressure of the film forming space, flow types of the gases and film forming temperature (substrate temperature and atmosphere temperature) are suitably selected as desired. These film forming factors are organically related to each other, and they are not determined individually but determined respectively under mutual relationships. In the present invention, the ratio of the gaseous starting material for formation of a deposited film and the gaseous halogenic oxidizing agent introduced into the reaction space may be determined suitably as desired in relationship of related film forming factors among the film forming factors as mentioned above, but it is preferably 1/100 to 100/1, more preferably 1/50 to 50/1 in terms of introducing flow rate ratio.

The pressure during mixing when introduced into the reaction space may be preferably higher in order to enhance the probability of chemical contact between the above gaseous starting material and the above gaseous halogenic oxidizing agent. However, if the pressure in the film forming space is too high, precursors formed by chemical contact will be collided against other precursors or the gaseous starting material, whereby secondary reactions are caused in the gas phase to effect polymerization to become a polymer which cannot contribute to film deposition. Also, the film formed by precursors which have undergone partial polymerization has poor quality. Accordingly, the pressure within the film forming space cannot be made too high and therefore the amount of the precursors formed by chemical contact is limited. For this reason, in the present invention, the pressure within the gas introducing means is made higher by narrowing the gas introducing port slender and also the pressure within the reaction chamber is suppressed lower to form a highly deposited film of high quality.

The pressure within the gas introducing means may be determined depending on the size of the gas introducing port and the gas flow rate, but in order to prepare precursors efficiently by increasing the chemical contact between the gaseous starting material and the gaseous halogenic oxidizing agent, it is generally 10 Torr or higher, more desirably 100 Torr or higher. Thus, by narrowing the gas introducing port slender to make the pressure within the gas introducing means higher, the above starting material for formation of deposited film and the halogenic oxidizing agent can be mixed with good efficiency to form efficiently the above precursors (E). The pressure within the film forming space should desirably be lower for the purpose of preventing the reaction of the precursors formed within the gas introducing port in the gas phase and also preventing entrainment of impurities. It is generally made 1 Torr or lower, preferably 0.1 Torr or lower.

The substrate temperature (Ts) during film formation can be set suitably as desired individually depending on the gas species employed and the kinds and required characteristics of the deposited film to be formed, but, in the case of obtaining an amorphous film, it is preferably from room temperature to 450° C., more preferably from 50° to 400° C. Particularly, in the case of forming a silicon deposited film with better semiconductor characteristics and photoconductive characteristics, etc., the substrate temperature (Ts) should desirably be made 70° to 350° C. On the other hand, in the case obtaining a polycrystalline film, it should preferably be 200° to 650° C., more preferably 300° to 600° C.

The atmosphere temperature (Tat) in the film forming space may be determined suitably as desired in relationship with the substrate temperature so that the above precursors (E) generated and the above precursors (D) are not changed to unsuitable chemical species for film formation, and also the above precursors (E) may be efficiently generated.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, Ir, Nb, Ta, V, Ti, Pt, Pd, etc., or alloys thereof.

As insulating substrates, there may be commonly be used films or sheets of synthetic resins including polyesters, polyethylene, polycarbonate, cellulose acetate, polypropylene, polyvinyl chloride, polyvinylidene chloride, polystyrene, polyamides, etc., glass, ceramics, paper and so on. At least one side surface of these substrates is preferably subjected to treatment for imparting electroconductivity, and it is desirable to provide other layers on the side at which said electroconductive treatment has been applied.

For example, electroconductive treatment of a glass substrate can be effected by providing a thin film of NiCr, Al, Cr, Mo, Au, Ir, Nb, Ta, V, Ti, Pt, Pd, $In_2O_3$, $SnO_2$, ITO ($In_2O_3 + SnO_2$), etc., thereon. Alternatively, a synthetic resin film such as polyester film can be subjected to the electroconductive treatment on its surface by e.g. vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with such a metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion between both is great, a large amount of strains may be created within the film to give sometimes no film of good quality, and therefore it is preferable to use a substrate so that the difference in thermal expansion between both is small.

Also, the surface condition of the substrate is directly related to the structure of the film (orientation) or generation of a stylet structures, and therefore it is desirable to treat the surface of the substrate to give such a film structure and a film texture that desired characteristics may be obtained.

In the following, the process for forming an A-Si film with the use of the device of the present invention is described by referring to examples.

EXAMPLE 1

By use of the film forming device shown in FIG. 2, a deposited film was prepared according to the process of the present invention as described below.

SiH$_4$ gas filled in the bomb 201 was introduced at a flow rate of 20 sccm through the gas introducing pipe 209, and F$_2$ gas diluted with He gas to 5 % filled in the bomb 203 at a flow rate of 400 sccm through the gas introducing pipe 210 into the reaction space.

The pressure within the gas introducing port 211 was 50 Torr. The pressure within the vacuum chamber 220 was made $1 \times 10^{-5}$ Torr As a substrate 218, a quarts glass (15 cm $\times$ 15 cm) was employed and the distance between the gas introducing port 211 and the substrate was set at 30 cm. Arround the gas introducing port, bluish white luminescence was observed. The substrate temperature (Ts) was set between room temperature and 400° C. as shown in Table 1 for respective samples.

When gases were permitted to flow under these conditions for 30 minutes, Si : H : F films with film thicknesses as shown in Table 1 were deposited on the substrate.

The distribution irregularity of the film thickness was measured to be within ±5%. Every sample of the Si : H : F film formed was confirmed to be amorphous by electron beam diffraction.

On the amorphous Si : H : F film of each sample, a comb-shaped electrode (gap length 200 μm) of aluminum was vapor deposited to prepare a sample for measurement of electroconductivity. Each sample was placed in a vacuum cryostat, a voltage of 100 V was applied and the current was measured by a microamperemeter (YHP4140B) to determine the dark electroconductivity ($\sigma$d). Also, light of 600 nm and 0.3 mw/cm$^2$ was irradiated to determine the photoconductivity ($\sigma$p). Further, from absorption of light, the optical band gap (Egopt) was determined. These results are shown in Table 1.

TABLE 1

|  | Sample | | | | |
| --- | --- | --- | --- | --- | --- |
|  | 1-1 | 1-2 | 1-3 | 1-4 | 1-5 |
| Substrate temperature (°C.) | 28 | 120 | 200 | 300 | 400 |
| Film thickness (μm) | 2.1 | 1.9 | 1.8 | 1.6 | 1.5 |
| $\sigma$d (S/cm) | $3 \times 10^{-11}$ | $4 \times 10^{-11}$ | $6 \times 10^{-11}$ | $8 \times 10^{-11}$ | $3 \times 10^{-9}$ |
| $\sigma$p (S/cm) | $7 \times 10^{-7}$ | $9 \times 10^{-7}$ | $3 \times 10^{-6}$ | $4 \times 10^{-6}$ | $2 \times 10^{-6}$ |
| Egopt (eV) | 1.70 | 1.65 | 1.65 | 1.60 | 1.55 |

EXAMPLE 2

By use of the film forming device shown in FIG. 3, a deposited film was prepared according to the method of the present invention as follows.

SiH$_4$ gas filled in the bomb 301 was introduced at a flow rate of 20 sccm through the gas introducing pipe 309, and F$_2$ gas diluted with He gas to 5% filled in the bomb 303 at a flow rate of 400 sccm through the gas introducing pipe 310 into the reaction space.

The pressure within the gas introducing port 211 was 50 Torr. The pressure within the vacuum chamber 120 was made $1 \times 10^{-5}$ Torr. As a substrate, a quartz glass (15 cm $\times$ 15 cm) was employed and the distance between the gas introducing port 211 and the substrate was set at 30 cm. In the meeting space 306, strong bluish white luminescence was observed. The substrate temperature (Ts) was set between room temperature and 400° C. as shown in Table 1 for respective samples.

When gases were permitted to flow under these conditions for 30 minutes, Si : H : F films with film thicknesses as shown in Table 1 were deposited on the substrate.

The distribution irregularity of the film thickness was measured to be within ±5%. Every sample of the Si : H : F film formed was confirmed to be amorphous by electron beam diffraction.

On the amorphous Si : H : F film of each sample, a comb-shaped electrode (gap length 200 μm) of aluminum was vapor deposited to prepare a sample for measurement of electroconductivity. Each sample was placed in a vacuum cryostat, a voltage of 100 V was applied and the current was measured by a microamperemeter (YHP4140B) to determine the dark electroconductivity ($\sigma$d). Also, light of 600 nm and 0.3 mw/cm$^2$ was irradiated to determine the photoconductivity ($\sigma$p). Further, from absorption of light, the optical band gap (Egopt) was determined. These results are shown in Table 2.

TABLE 2

| | Sample | | | | |
|---|---|---|---|---|---|
| | 2-1 | 2-2 | 2-3 | 2-4 | 2-5 |
| Substrate temperature (°C.) | 28 | 120 | 200 | 300 | 400 |
| Film thickness ($\mu$m) | 4.3 | 4.0 | 3.8 | 3.5 | 3.1 |
| $\sigma$d (S/cm) | $6 \times 10^{-11}$ | $5 \times 10^{-11}$ | $8 \times 10^{-11}$ | $7 \times 10^{-11}$ | $2 \times 10^{-9}$ |
| $\sigma$p (S/cm) | $4 \times 10^{-7}$ | $6 \times 10^{-7}$ | $2 \times 10^{-6}$ | $3 \times 10^{-6}$ | $2 \times 10^{-6}$ |
| Egopt (eV) | 1.70 | 1.70 | 1.65 | 1.65 | 1.65 |

EXAMPLE 3

By use of the film forming device shown in FIG. 4, a deposited film was prepared according to the method of the present invention as described below.

SiH$_4$ gas filled in the bomb 401 was introduced at a flow rate of 20 sccm through the gas introducing pipe 409, the F$_2$ gas diluted to He gas to 10% filled in the bomb 403 at a flow rate of 200 sccm through the gas introducing pipe 410 into the reaction space.

Bluish white luminescence was strongly observed in the mixing region of SiH$_4$ gas and F$_2$ gas.

Next, GeH$_4$ gas filled in the bomb 405 was introduced through the gas introducing pipe 423 at a flow rate of 5 sccm, and the F$_2$ gas diluted to 10% with He gas filled in the bomb 407 at a flow rate of 20 sccm through the gas introducing pipe 424 into the gas introducing port 412. Similar luminescence was also observed in the mixing region of GeH$_4$ gas and F$_2$ gas.

The pressure within the vacuum chamber 420 was 200 mTorr. By use of quartz glass (15 cm × 15 cm) as the substrate, the distance between the gas introducing port 411 and the substrate was set at 5 cm.

The substrate temperature (Ts) was set at 200° C.

When gases were permitted to flow under these conditions for 30 minutes, SiGe : H : F film with film thickness of 15 $\mu$ was deposited on the substrate.

The distribution irregularity of the film thickness was measured to be within ±5%. The SiGe : H : F film formed was confirmed to be amorphous by electron beam diffraction.

On the amorphous SiGe : H : F film sample, a comb-shaped electrode (gap length 200 $\mu$m) of aluminum was vapor deposited to prepare a sample for measurement of electroconductivity. Each sample was placed in a vacuum cryostat, a voltage of 100 V was applied and the current was measured by a micro-amperemeter (YHP4140B) to determine the dark electroconductivity ($\sigma$d) of $6 \times 10^{-9}$ S/cm. Also, light of 700 nm and ($\sigma$p) was measured to be $2 \times 10^{-6}$ S/cm. Further, from absorption of light obtained as to a sample prepared under similar conditions, the optical band gap (Egopt) of 1.45 eV was determined.

We claim:

1. A device for introducing a gaseous starting material for formation of a deposited film on a substrate in a film forming space and a gaseous halogenic oxidizing agent having the property of oxidation action on said starting material, comprising:

a plurality of conduits which are coaxially aligned, each conduit having an exit orifice which includes a converted tip end, said plurality including an outer conduit adapted to carry said gaseous halogenic oxidizing agent and at least one inner conduit adapted to carry said gaseous starting material, said coaxially aligned conduits extending into the film forming space and positioned relative to one another such that the aqueous halogenic oxidizing agent exiting the outer conduit is capable of surrounding the gaseous starting material exiting said inner conduit so as to effect chemical contact therebetween and form a plural number of precursors containing at least one precursor in an excited state and thereby forming the deposited film on said substrate using said at least one precursor as a feeding source for a constituent element of the deposited film, and a means for positioning said substrate in said film forming space, said substrate spaced by said means for positioning said substrate such that said substrate is from several millimeters to 20 centimeters from the exit orifice of said outer conduit, wherein said exit orifice of the outer conduit extends coaxially beyond the exit orifice of said at least one inner conduit by about 1 cm, thereby forming a meeting space for said gaseous starting material and said gaseous oxidizing agent.

2. A device to claim 1 further including a means for measurement of said substrate temperature.

3. A device for introducing a gaseous starting material for formation of a deposited film on a substrate in a film forming space and a gaseous halogenic oxidizing agent having the property of oxidation action on said starting material, comprising:

means for supplying said gaseous starting material;

means for supplying said gaseous halogenic oxidizing agent;

a plurality of conduits which are coaxially aligned for introducing said gaseous starting material and said gaseous halogenic oxidizing agent in said film forming space, each conduit having an exit orifice which includes a converted tip end, said plurality of including an outer conduit which is in fluid communication with said gaseous halogenic oxidizing agent supply means and is adapted to carry said gaseous halogenic oxidizing agent and at least one inner conduit which is in fluid communication with said gaseous starting material supply means and is adapted to carry said gaseous starting material, said coaxially aligned conduits extending into the film forming space and positioned relative to one another such that the gaseous halogenic oxidizing agent exiting the outer conduit is capable of surrounding the gaseous starting material exiting said inner conduit so as to effect chemical contact therebetween and form a plural number of precursors containing at least one precursor in an excited state and thereby forming the deposited film on said substrate using said at least one precursor as a feeding source for a constituent element of the deposited film; and a means for positioning said substrate, said substrate spaced by said substrate positioning means such that said substrate is from several millimeters to 20 centimeters from the exit orifice of said outer conduit; wherein said exit orifice of the outer conduit extends coaxially beyond the exit orifice of said at least one inner conduit by about 1 cm, thereby forming a meeting space for said gaseous starting material and said gaseous oxidizing agent.

4. A device according to claim 3 further including a means for measurement of said substrate temperature.

* * * * *

UNITED STATES PATENT AND TRADEMARK OFFICE
CERTIFICATE OF CORRECTION

PATENT NO. : 5,160,543　　　　　　　　　　　　　　Page 1 of 3
DATED     : November 3, 1992
INVENTOR(S) : SHUNICHI ISHIHARA ET AL.

It is certified that error appears in the above-indentified patent and that said Letters Patent is hereby corrected as shown below:

On the Title Page:

AT [56] REFERENCES CITED

Foreign Patent Documents, insert
--598630   3/1978   USSR   156/613--.

AT [57] ABSTRACT

Line 6, "converted" should read --converged--.

COLUMN 1

Line 32, "so called" should read --so-called--.

COLUMN 2

Line 13, "give" should be deleted.
Line 35, "give damages" should read --causes damage--.
Line 37, "much" should read --many--.

COLUMN 3

Line 19, "above-explaned" should read --above-explained--.
Line 49, "to $F_2(5)$/He" should read --to as $F_2(5)$/He--.

UNITED STATES PATENT AND TRADEMARK OFFICE
CERTIFICATE OF CORRECTION

PATENT NO. : 5,160,543
DATED : November 3, 1992
INVENTOR(S) : SHUNICHI ISHIHARA ET AL.

It is certified that error appears in the above-indentified patent and that said Letters Patent is hereby corrected as shown below:

COLUMN 4

Line 36, "and said standing" should read --agent having the--.
    Line 37, "for" should read --on--.
    Line 39, "precrsors" should read --precursors--.

COLUMN 5

Line 65, "converted" should read --converged--.
    Line 66, "chemically" should read --chemically with--.
    Line 68, "thereon" should read --thereon.--.

COLUMN 6

Line 24, "device" should read --device for--.

COLUMN 7

Line 53, "412" should read --422-- and "substrate" (second occurrence) should read --substrate 418--.

COLUMN 9

Line 8, "a" should be deleted.

COLUMN 10

Line 37, "case" should read --case of--.
    Line 54, "be" (second occurrence) should be deleted.

UNITED STATES PATENT AND TRADEMARK OFFICE
CERTIFICATE OF CORRECTION

PATENT NO. : 5,160,543
DATED : November 3, 1992
INVENTOR(S) : SHUNICHI ISHIHARA ET AL.

It is certified that error appears in the above-indentified patent and that said Letters Patent is hereby corrected as shown below:

COLUMN 11

Line 14, "strains" should read --strain--.
Line 56, "quarts" should read --quartz--.

COLUMN 13

Line 19, "diluted to" should read --diluted with--.
Line 50, "and ($\sigma$p) should read --and 0.3 mw/cm$^2$ was irradiated and the photoconductivity ($\sigma$p)--.
Line 63, "converted" should read --converged--.

COLUMN 14

Line 32, "device to" should read --device according to--.
Line 46, "converted" should read --converged--.
Line 47, "of" should be deleted.

Signed and Sealed this

Thirteenth Day of September, 1994

Attest:

BRUCE LEHMAN

Attesting Officer     Commissioner of Patents and Trademarks